US008878206B2

(12) United States Patent
Lee et al.

(10) Patent No.: US 8,878,206 B2
(45) Date of Patent: Nov. 4, 2014

(54) ORGANIC LIGHT EMITTING DISPLAY APPARATUS INCLUDING AN AUXILIARY LAYER AND METHOD FOR MANUFACTURING THE SAME

(75) Inventors: Sang-Pil Lee, Yongin (KR); Young-Rok Song, Yongin (KR); Jung-Bae Song, Yongin (KR); Beom-Rak Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 416 days.

(21) Appl. No.: 13/186,352

(22) Filed: Jul. 19, 2011

(65) Prior Publication Data

US 2012/0018749 A1  Jan. 26, 2012

(30) Foreign Application Priority Data

Jul. 23, 2010  (KR) .................. 10-2010-0071597

(51) Int. Cl.
*H01L 29/20* (2006.01)
(52) U.S. Cl.
USPC .................. 257/89; 257/E33.069; 438/29
(58) Field of Classification Search
USPC ................ 257/89, E33.069; 438/29
See application file for complete search history.

(56) References Cited

U.S. PATENT DOCUMENTS

| 6,541,130 | B2 * | 4/2003 | Fukuda ................ 428/690 |
| 6,639,250 | B1 * | 10/2003 | Shimoda et al. ............ 257/98 |
| 6,861,800 | B2 * | 3/2005 | Tyan et al. ................ 313/506 |
| 8,052,497 | B2 * | 11/2011 | Yoon ........................ 445/24 |
| 8,344,619 | B2 * | 1/2013 | Song ......................... 313/506 |
| 8,519,413 | B2 * | 8/2013 | Jeong et al. .................. 257/79 |
| 2003/0042848 | A1 * | 3/2003 | Park et al. ................ 313/503 |
| 2003/0044639 | A1 * | 3/2003 | Fukuda ................ 428/690 |
| 2005/0233168 | A1 * | 10/2005 | Magno et al. ............... 428/690 |
| 2005/0249972 | A1 * | 11/2005 | Hatwar et al. ............. 428/690 |
| 2005/0280008 | A1 * | 12/2005 | Ricks et al. .................. 257/79 |
| 2005/0280355 | A1 * | 12/2005 | Lee et al. ................ 313/503 |
| 2006/0017377 | A1 * | 1/2006 | Ryu ........................ 313/504 |
| 2006/0097264 | A1 * | 5/2006 | Kim et al. .................... 257/72 |
| 2006/0138945 | A1 * | 6/2006 | Wolk et al. ................ 313/506 |
| 2006/0175961 | A1 | 8/2006 | Choong |
| 2006/0181204 | A1 * | 8/2006 | Zhu et al. ................. 313/506 |

(Continued)

FOREIGN PATENT DOCUMENTS

JP    2006-222082    8/2006
JP    2006-269326    10/2006

(Continued)

*Primary Examiner* — Caleb Henry
(74) *Attorney, Agent, or Firm* — Christie, Parker & Hale, LLP

(57) ABSTRACT

An organic light emitting display apparatus is manufactured using a simplified manufacturing process and prevents or reduces the formation of dark spots. The organic light emitting display apparatus includes: red, green, and blue sub-pixel regions, each including a first electrode on a substrate; a distributed Bragg reflector (DBR) layer between the substrate and the first electrode; a hole injection layer on the DBR layer and covering the first electrode; a hole transport layer on the hole injection layer; an auxiliary layer between the hole injection layer and the hole transport layer in the green sub-pixel region; a green light-emission layer on the hole transport layer in the blue and green sub-pixel regions; a blue light-emission layer on the green light-emission layer in the blue sub-pixel region; and a red light-emission layer on the hole transport layer in the red sub-pixel region.

36 Claims, 3 Drawing Sheets

(56) References Cited

U.S. PATENT DOCUMENTS

| | | | |
|---|---|---|---|
| 2007/0015429 A1* | 1/2007 | Maeda et al. | 445/24 |
| 2007/0046195 A1* | 3/2007 | Chin et al. | 313/506 |
| 2007/0075312 A1* | 4/2007 | Chin et al. | 257/40 |
| 2007/0146242 A1* | 6/2007 | Miller et al. | 345/76 |
| 2007/0286944 A1* | 12/2007 | Yokoyama et al. | 427/66 |
| 2007/0296334 A1* | 12/2007 | Matsuda | 313/506 |
| 2008/0111474 A1* | 5/2008 | Sung et al. | 313/504 |
| 2008/0224595 A1* | 9/2008 | Nakamata et al. | 313/500 |
| 2008/0238297 A1* | 10/2008 | Oota | 313/500 |
| 2008/0238308 A1* | 10/2008 | So | 313/504 |
| 2009/0015141 A1* | 1/2009 | Wang et al. | 313/504 |
| 2009/0059404 A1* | 3/2009 | Wang et al. | 359/850 |
| 2009/0231243 A1* | 9/2009 | Song | 345/76 |
| 2009/0291237 A1* | 11/2009 | Park et al. | 428/32.6 |
| 2009/0295284 A1* | 12/2009 | Park et al. | 313/504 |
| 2010/0053043 A1* | 3/2010 | Sakamoto | 345/77 |
| 2010/0132722 A1 | 6/2010 | Ochi | |
| 2011/0031515 A1* | 2/2011 | Mizuno et al. | 257/89 |
| 2011/0042696 A1* | 2/2011 | Smith et al. | 257/89 |
| 2012/0091883 A1* | 4/2012 | Nagai et al. | 313/504 |

FOREIGN PATENT DOCUMENTS

| | | |
|---|---|---|
| KR | 10-0306237 B1 | 8/2001 |
| KR | 10-2003-0002182 | 1/2003 |
| KR | 10-2007-0047849 A | 5/2007 |
| KR | 10-2007-0078501 A | 8/2007 |

\* cited by examiner

ORGANIC LIGHT EMITTING DISPLAY APPARATUS INCLUDING AN AUXILIARY LAYER AND METHOD FOR MANUFACTURING THE SAME

CROSS-REFERENCE TO RELATED APPLICATION

This application claims priority to and the benefit of Korean Patent Application No. 10-2010-0071597, filed on Jul. 23, 2010 in the Korean Intellectual Property Office, the disclosure of which is incorporated herein in its entirety by reference.

BACKGROUND

1. Field

One or more aspects of embodiments according to the present invention relate to organic light emitting display apparatuses and methods of manufacturing the same.

2. Description of the Related Art

In general, an organic light emitting device (OLED) has a structure in which an organic light emission layer formed as a functional thin film is interposed between an anode and a cathode. Holes are injected via the anode, and electrons are injected via the cathode, and then the electrons and the holes combine in the organic light emission layer so that excitons are formed therein and emit light while recombining with each other.

In order to realize a full-color organic light emitting display apparatus, an independent light emission method, a color filter method, a color conversion method, or the like may be used. The independent light emission method involves thermally depositing each red (R), green (G), and blue (B) light emitting material by using a metal shadow mask having an elaborate pattern so as to realize R, G, and B colors. The color filter method involves forming a white light emission layer and then patterning R, G, and B color filters so as to realize R, G, and B colors. The color conversion method involves forming a blue light-emission layer and then using a color conversion layer for converting a blue color into green and red colors so as to realize R, G, and B colors.

In an organic light emitting display apparatus using the color filter method, an efficiency of an emitted white light decreases while passing through a color filter, and thus a highly efficient white light emitting material is required, and an overall efficiency is low, compared to a fine patterning method using the metal shadow mask.

With regard to the independent light emission method that involves depositing and patterning the R, G, and B light emitting materials by using a fine metal shadow mask, when the size and resolution of a display are increased, it is difficult to enlarge an organic light emission panel due to difficulties in manufacturing the fine metal shadow mask. Also, in order to deposit an auxiliary layer and the R, G, and B light emitting materials, an elaborate alignment equipment is used. In this regard, when a pixel of a thin-film transistor (TFT) substrate and the fine metal shadow mask are aligned, a defective pixel may be formed due to damaged organic materials that were previously deposited. Also, a large fine metal shadow mask is difficult to manufacture and is very expensive.

SUMMARY

According to one or more aspects of embodiments of the present invention, an organic light emitting display apparatus can prevent or reduce the formation of dead pixels while reducing the number of times of changing a fine metal mask (FMM) during a manufacture of the organic light emitting display apparatuses, compared to a conventional red (R), green (G), and blue (B) independent patterning method.

According to an embodiment of the present invention, an organic light emitting display apparatus includes a plurality of sub-pixel regions including a red sub-pixel region, a green sub-pixel region, and a blue sub-pixel region, each of the sub-pixel regions including a first electrode on a substrate; a distributed Bragg reflector (DBR) layer between the substrate and the first electrode; a hole injection layer on the DBR layer and covering the first electrode; a hole transport layer on the hole injection layer; an auxiliary layer between the hole injection layer and the hole transport layer in the green sub-pixel region; a green light-emission layer on the hole transport layer in the blue sub-pixel region and the green sub-pixel region; a blue light-emission layer on the green light-emission layer in the blue sub-pixel region; and a red light-emission layer on the hole transport layer in the red sub-pixel region.

The DBR layer may be formed by alternately stacking a first layer and a second layer, wherein the first layer and the second layer have different refractive indexes.

A refractive index of the first layer may be less than a refractive index of the second layer.

The first layer may include silicon oxide (SiOx), and the second layer may include silicon nitride (SiNx).

The organic light emitting display apparatus may further include a passivation layer between the substrate and the DBR layer.

The passivation layer may have a thickness of about 3000 Å to about 6000 Å.

The green light-emission layer may have a hole transport ability.

The auxiliary layer may have a hole transport ability.

The auxiliary layer may include a same material as the hole transport layer.

According to another embodiment of the present invention, an organic light emitting display apparatus includes a plurality of sub-pixel regions including a red sub-pixel region, a green sub-pixel region, and a blue sub-pixel region, each of the sub-pixel regions including a first electrode on a substrate; a distributed Bragg reflector (DBR) layer between the substrate and the first electrode; a hole injection layer on the DBR layer and covering the first electrode; a hole transport layer on the hole injection layer; an auxiliary layer between the hole injection layer and the hole transport layer in the red sub-pixel region; a red light-emission layer on the hole transport layer in the blue sub-pixel region and the red sub-pixel region; a blue light-emission layer on the red light-emission layer in the blue sub-pixel region; and a green light-emission layer on the hole transport layer in the green sub-pixel region.

The DBR layer may be formed by alternately stacking a first layer and a second layer, wherein the first layer and the second layer have different refractive indexes.

A refractive index of the first layer may be less than a refractive index of the second layer.

The first layer may include silicon oxide (SiOx), and the second layer may include silicon nitride (SiNx).

The organic light emitting display apparatus may further include a passivation layer between the substrate and the DBR layer.

The passivation layer may have a thickness of about 3000 Å to about 6000 Å.

The red light-emission layer may have a hole transport ability.

The auxiliary layer may have a hole transport ability.

The auxiliary layer may include a same material as the hole transport layer.

According to another embodiment of the present invention, a method of manufacturing an organic light emitting display apparatus includes forming a distributed Bragg reflector (DBR) layer on a substrate on which a red sub-pixel region, a green sub-pixel region, and a blue sub-pixel region are located; forming a first electrode on the DBR layer and corresponding to the red, green, and blue sub-pixel regions; forming a hole injection layer on the substrate and covering the first electrode; forming an auxiliary layer on the hole injection layer in the green sub-pixel region; forming a hole transport layer on the hole injection layer and covering the auxiliary layer; forming a green light-emission layer on the hole transport layer in the blue sub-pixel region and the green sub-pixel region; and forming a blue light-emission layer on the green light-emission layer in the blue sub-pixel region.

The DBR layer may be formed by alternately stacking a first layer and a second layer, wherein the first layer and the second layer have different refractive indexes.

A refractive index of the first layer may be less than a refractive index of the second layer.

The first layer may include silicon oxide (SiOx), and the second layer may include silicon nitride (SiNx).

The method may further include forming a passivation layer on the substrate, prior to the forming of the DBR layer.

The passivation layer may have a thickness of about 3000 Å to about 6000 Å.

The green light-emission layer may have a hole transport ability.

The auxiliary layer may have a hole transport ability.

The method may further include forming a red light-emission layer on the hole transport layer in the red sub-pixel region.

The auxiliary layer may include a same material as the hole transport layer.

According to another embodiment of the present invention, a method of manufacturing an organic light emitting display apparatus includes forming a distributed Bragg reflector (DBR) layer on a substrate on which a red sub-pixel region, a green sub-pixel region, and a blue sub-pixel region are located; forming a first electrode on the DBR layer and corresponding to the red, green, and blue sub-pixel regions; forming a hole injection layer on the substrate and covering the first electrode; forming an auxiliary layer on the hole injection layer in the red sub-pixel region; forming a hole transport layer on the hole injection layer and covering the auxiliary layer; forming a red light-emission layer on the hole transport layer in the blue sub-pixel region and the red sub-pixel region; and forming a blue light-emission layer on the red light-emission layer in the blue sub-pixel region.

The DBR layer may be formed by alternately stacking a first layer and a second layer, wherein the first layer and the second layer have different refractive indexes.

A refractive index of the first layer may be less than a refractive index of the second layer.

The first layer may include silicon oxide (SiOx), and the second layer may include silicon nitride (SiNx).

The method may further include forming a passivation layer above the substrate, prior to the forming of the DBR layer.

The passivation layer may have a thickness of about 3000 Å to about 6000 Å.

The red light-emission layer may have a hole transport ability.

The auxiliary layer may have a hole transport ability.

The method may further include forming a green light-emission layer on the hole transport layer in the green sub-pixel region.

The auxiliary layer may include a same material as the hole transport layer.

BRIEF DESCRIPTION OF THE DRAWINGS

The above and other features and aspects of the present invention will become more apparent by describing in detail some exemplary embodiments thereof with reference to the attached drawings in which.

DETAILED DESCRIPTION

Figure 1:
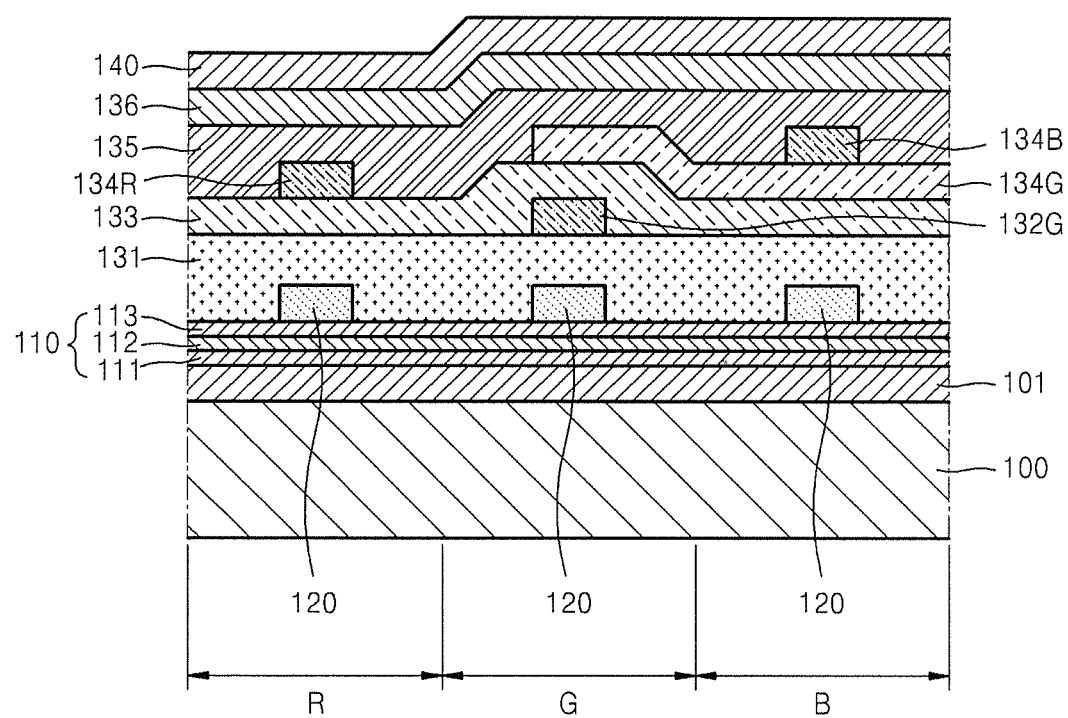
FIG. 1 is a schematic cross-sectional view of an organic light emitting display apparatus according to an embodiment of the present invention.

In the following detailed description, some exemplary embodiments of the present invention are shown and described, by way of illustration. As those skilled in the art would realize, the described embodiments may be modified in various ways without departing from the spirit and scope of the present invention. Accordingly, the drawings and description are to be regarded as illustrative in nature and not restrictive. In addition, when an element or layer is referred to as being "on" another element or layer, it can be directly on the another element or layer or be indirectly on the another element or layer with one or more intervening elements or layers interposed therebetween. Hereinafter, like reference numerals refer to like elements.

FIG. 1 is a schematic cross-sectional view of an organic light emitting display apparatus according to an embodiment of the present invention.

Referring to FIG. 1, an organic light emitting device (OLED, e.g., organic light emitting diode) of an organic light emitting display apparatus includes a substrate 100, and red (R), green (G), and blue (B) sub-pixel regions that are formed on the substrate 100.

The substrate 100 may be formed of a transparent glass material, a plastic material, or a metal foil, but is not limited thereto, and thus a substrate that is generally used in an organic light emitting display apparatus may be used, wherein the substrate has good mechanical strength, thermal stability, transparency, surface smoothness, easy usage, and waterproofness. Although not illustrated in FIG. 1, each of the R, G, and B sub-pixel regions, or sub-pixels, of the substrate 100 may include at least one thin-film transistor (TFT) and/or capacitor, and a pixel circuit may be implemented using the TFT and the capacitor.

A passivation layer 101 may be formed on the substrate 100. The passivation layer 101, for example, may be formed of silicon nitride (SiNx), and may have a thickness of about 3000 Å to about 6000 Å.

A distributed Bragg reflector (DBR) layer 110 may be formed on the passivation layer 101. The DBR layer 110 may be formed by alternately (e.g., sequentially) stacking a first layer 111, a second layer 112, and a first layer 113. In one embodiment, the first layer 111 and the second layer 112 have different refractive indexes. For example, the refractive index of the first layer 111 may be less than that of the second layer 112. The first layer 111 may be formed of silicon oxide (SiOx), and the second layer 112 may be formed of SiNx. The first layer 113 is made of the same (or substantially the same) material as the first layer 111, and may also be referred to as a third layer 113. In FIG. 1, the DBR layer 110 includes the first layer 111, the second layer 112, and the first layer 113, but embodiments of the present invention are not limited thereto. That is, in another embodiment, the DBR layer 110 may include four or more layers.

In the passivation layer 101 and the DBR layer 110, a layer having a small refractive index (e.g., the first layer 111 and the first layer 113) and a layer having a large refractive index (e.g., the passivation layer 101 and the second layer 112) are alternately arranged, and thus resonance effects are caused by a difference in refractive index between the layers, thereby improving light emission efficiency and color purity.

First electrodes 120 and a second electrode 140 are arranged on, or above, the substrate 100 so as to face each other. The first electrodes 120 may be patterned for each of the R, G, and B sub-pixels, and may be an anode or a cathode. The second electrode 140 corresponds to the first electrodes 120, and may be a cathode or an anode. The second electrode 140 may be formed on an electron injection layer 136, such as by using a vacuum evaporation method or a sputtering method.

In order to display (or project) an image toward the substrate 100, the first electrode 120 may be a transparent electrode and the second electrode 140, may be a reflective ele), zinc oxidectrode. The first electrode 120 may be formed of indium tin oxide (ITO), indium zinc oxide (IZO (ZnO), or indium oxide ($In_2O_3$) having a high work function, and the second electrode 140 may be formed of a metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any combinations or alloys thereof.

As described above, if the substrate 100 includes a TFT, the first electrode 120 that is patterned for each of the R, G, and B sub-pixels is electrically connected to the TFT in each of the R, G, and B sub-pixels. In this case, the second electrode 140 may be formed as a common electrode that extends over the R, G, and B sub-pixels so as to cover (e.g., entirely or substantially entirely) all of the R, G, and B sub-pixels.

If the substrate 100 does not include the TFT for each of the R, G, and B sub-pixels, the first electrode 120 and the second electrode 140 may be patterned as crossing stripe patterns, and thus may perform a passive matrix (PM) drive.

An organic layer is interposed between the first electrode 120 and the second electrode 140. The organic layer, in one embodiment, includes a hole injection layer 131, an auxiliary layer 132G, a hole transport layer 133, a red light-emission layer 134R, a green light-emission layer 134G, a blue light-emission layer 134B, an electron transport layer 135, and the electron injection layer 136, which are sequentially arranged.

Although not illustrated in FIG. 1, a pixel-defining layer covering end and side portions of the first electrode 120 may be formed above the first electrode 120. The pixel-defining layer may be formed of an organic material, an inorganic material, or an organic-inorganic material multi-layer. The inorganic material may be selected from the group consisting of silicon dioxide ($SiO_2$), silicon nitride (SiNx), and silicon oxynitride (SiON). The organic material may be selected from the group consisting of an acryl-based organic compound, polyamide, and polyimide, which are organic insulating materials.

The hole injection layer 131 may be formed as a common layer with respect to the R, G, and B sub-pixels by using an open mask, wherein the common layer is above the substrate 100 whereon the first electrode 120 is formed. The hole injection layer 131, in one embodiment, has a thickness between about 300 Å and about 1000 Å for smooth hole injection, but the thickness thereof may vary according to the materials of other layers. The hole injection layer 131 may include 4,4', 4"-Tris(N-(2-naphthyl)-N-phenyl-amino)-triphenylamine (2-TNATA), Copper Phthalocyanine (CuPc), Tris(4-carbazoyl-9-ylphenyl)amine (TCTA), which is a starburst type amine, 4,4',4"-tris-(3-methylphenylphenylamino)triphenylamine (m-MTDATA), or IDE406 (manufactured by IDEMITSU KOSAN, LTD.), but a material of the hole injection layer 131 is not limited thereto, and thus any other material suitable for smooth hole injection may be used.

The hole transport layer 133 having high hole mobility and smooth hole transport is formed on the hole injection layer 131.

The hole transport layer 133 may be formed as a common layer with respect to the R, G, and B sub-pixels by using an open mask. The thickness of the hole transport layer 133, in one embodiment, is between about 300 Å and about 1500 Å, but the thickness thereof may vary according to the materials of other layers. Although a deposition condition and a coating condition of the hole transport layer 133 may vary according to compounds used, in general, the deposition condition and the coating condition may be selected similarly as those for the formation of the hole injection layer 131. The material of the hole transport layer 133 is not specifically limited, and the hole transport layer 133 may include carbazole derivatives including N-phenylcarbazole, polyvinylcarbazole, and the like, 4,4'-bis[N-(1-naphthyl)-N-phenylamino]biphenyl (NPB), N,N'-bis(3-methylphenyl)-N,N-diphenyl-[1,1'-biphenyl]-4,4'-diamine (TPD), N,N'-diphenyl-N,N-bis(1-naphthyl)-1,1 biphenyl-4,4diamine (α-NPD), IDE320 (manufactured by IDEMITSU KOSAN, LTD.), or the like.

The auxiliary layer 132G is arranged between the hole injection layer 131 and the hole transport layer 133 in the green (G) sub-pixel region. The auxiliary layer 132G is arranged between the hole injection layer 131 and the hole transport layer 133 in the green (G) sub-pixel region so as to adjust a resonance period of green light.

The auxiliary layer 132G functions to adjust the thickness of the organic layer of the G sub-pixel so as to adjust the resonance period of the green light. The auxiliary layer 132G, in one embodiment, has a thickness between about 300 Å and about 1500 Å so as to increase light emission efficiency, color purity, and the like, of the green light. The auxiliary layer 132G may be formed only in the G sub-pixel region by using a fine metal mask (FMM). The material of the auxiliary layer 132G may be the same (or substantially the same) as that of the hole transport layer 133.

Light emission layers 134R, 134G and 134B are formed above the hole transport layer 133. The light emission layers 134R, 134G and 134B include the green light-emission layer 134G that is stacked in the G and B sub-pixel regions, and the red light-emission layer 134R that is arranged in the R sub-pixel region. That is, the green light-emission layer 134G is commonly arranged in the G and B sub-pixel regions.

The red light-emission layer 134R, the green light-emission layer 134G, and the blue light-emission layer 134B are formed above the hole transport layer 133 by using the FMM. In this case, the green light-emission layer 134G is stacked as a common layer in the G and B sub-pixel regions. Thus, a mask having a larger opening may be used so that, for example, it is advantageous for a manufacture of a large display panel, compared to a case in which a light emission layer is formed in each sub-pixel. The red light-emission layer 134R, in one embodiment, is only stacked in the red (R) sub-pixel region by using the FMM.

The auxiliary layer 132G is arranged in the G sub-pixel region so as to adjust the resonance period of the green light, and the green light-emission layer 134G is arranged in the G and B sub-pixel regions so as to adjust a resonance period of blue light of the B sub-pixel. Thus, the green light-emission layer 134G functions as both an emission layer of the green light, and as an auxiliary layer of the B sub-pixel. In one embodiment, the green light-emission layer 134G has a hole transport ability.

As described above, since the blue light-emission layer 134B is formed above the green light-emission layer 134G that is commonly stacked in the G and B sub-pixel regions, formation of dark spots may be prevented or reduced in a B sub-pixel. Generally, when a typical organic light emitting display apparatus is used for a long time, progressive dark spots may be formed in a B sub-pixel. However, according to the present embodiment, as described above, since the blue light-emission layer 134B is formed above the green light-emission layer 134G, the thickness of an organic material in the B sub-pixel generating blue light is increased, thereby reducing or preventing the formation of dark spots in the B sub-pixel.

The red, green, and blue light-emission layers 134R, 134G, and 134B may be formed with various known light emitting materials, and may be formed with a known host and dopant. The dopant may include a known fluorescent dopant and/or a known phosphorescent dopant. For example, the green light-emission layer 134G may include a host and red dopant having beneficial hole transport characteristics.

The host of the light emission layer 134 may include aluminum tris(8-hydroxyquinoline (Alq3), 4,4'-di(N-carbazolyl)biphenyl (CBP), distyryl arylene (DSA), GDI1403 that is red phosphorescent host (manufactured by Gracel Co.), and/or the like, but is not limited thereto.

An amount of the dopant of the light emission layer 134 may be between about 0.1 to about 20 parts by weight, such as, in one embodiment, between about 0.5 to about 15 parts by weight based on 100 parts by weight of a light emission layer-forming material (i.e., a total weight of the host and dopant is 100 parts by weight). If the amount of the dopant is less than 0.1 parts by weight, an effect of adding the dopant is small, and if the amount of the dopant is greater than 20 parts by weight, concentration extinction such as concentration quenching is caused on fluorescence and phosphorescence.

In consideration of light emission efficiency, the thickness of the red light-emission layer 134R may be between about 500 Å and about 2000 Å, the thickness of the green light-emission layer 134G may be between about 100 Å and about 1000 Å, and the thickness of the blue light-emission layer 134B may be between about 100 Å and about 500 Å.

The electron transport layer 135 is formed on the green light-emission layer 134G, the blue light-emission layer 134B, and the red light-emission layer 134R above a front side of the substrate 100 by using an open mask. The thickness of the electron transport layer 135 may be between about 100 Å and about 800 Å, and may vary according to the materials of other layers. The electron transport layer 135 functions to facilitate electron transport, thereby allowing efficient electron transport. A material of the electron transport layer 135 is not specifically limited, and may be selected from among known materials for forming an electron transport layer. For example, a quinoline derivative material including Alq3, 3-(4-biphenylyl)-4-phenyl-5-(4-tert-butylphenyl)-1,2,4-triazole (TAZ), and the like may be used.

The electron injection layer 136 is formed on the electron transport layer 135 above the front side of the substrate 100 by using the open mask. The thickness of the electron injection layer 136 may be between about 1 Å and about 100 Å, and may vary according to the materials of other layers. The electron injection layer 136 may be formed of a material that facilitates the injection of electrons from the second electrode 140, wherein the material may be selected from the group consisting of lithium fluoride (LiF), NaC, cesium fluoride (CsF), lithium oxide ($Li_2O$), barium oxide (BaO), Liq, and combinations thereof.

Although not illustrated in FIG. 1, a hole blocking layer may be selectively formed between the light emission layers 134G, 134B, 134R and the electron transport layer 135 by using a hole blocking layer-forming material. The hole blocking layer-forming material is not specifically limited but should have a hole transport ability and should have an ionization potential greater than a light emission compound. Examples of the hole blocking layer-forming material include bis(2-methyl-8-quinolinolato)(4-phenylphenolato) aluminum (BAlq), bathocuproine (BCP), N-arylbenzimidazoles trimer (TPBI), and the like.

As described above, in one embodiment, the green light-emission layer 134G is commonly arranged in the G and B sub-pixel regions. Thus, it is not necessary to additionally use the FMM to form an auxiliary layer in the B sub-pixel region, so that a process may be simplified by using the FMM four times.

Figure 2:
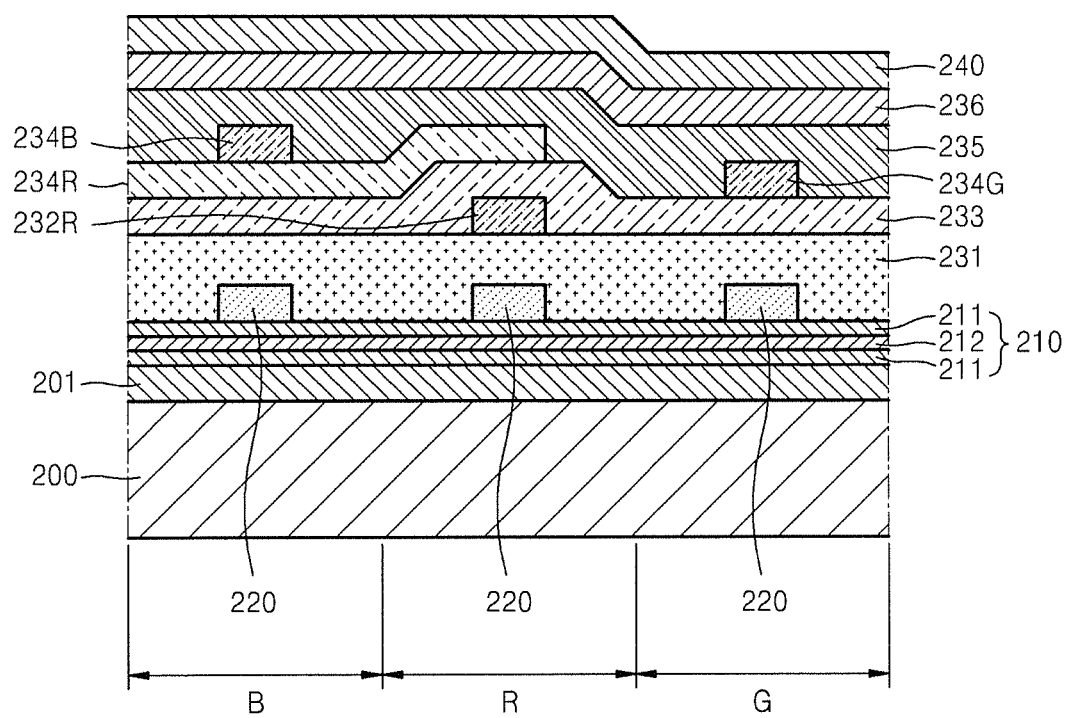
FIG. 2 is a schematic cross-sectional view of an organic light emitting display apparatus according to another embodiment of the present invention.

FIG. 2 is a schematic cross-sectional view of an organic light emitting display apparatus according to another embodiment of the present invention.

Similar to the organic light emitting display apparatus of FIG. 1, an OLED of the organic light emitting display apparatus according to the present embodiment includes a substrate 200 and R, G, and B sub-pixel regions formed on the substrate 200. However, the organic light emitting display apparatus according to the present embodiment is different from the organic light emitting display apparatus of FIG. 1 in that a red light-emission layer 234R is stacked in B and R sub-pixel regions. Thus, a structure and a detailed description for a manufacturing process of the structure, which are the same as those in the organic light emitting display apparatus of FIG. 1, will be omitted.

Referring to FIG. 2, a passivation layer 201 and a DBR layer 210 are arranged on the substrate 200. First electrodes 220 and a second electrode 240 are arranged above the DBR layer 210 so as to face each other. An organic layer is interposed between the first electrodes 220 and the second electrode 240, wherein the organic layer includes a hole injection layer 231, an auxiliary layer 232R, a hole transport layer 233, the red light-emission layer 234R, a green light-emission layer 234G, a blue light-emission layer 234B, an electron transport layer 235, and an electron injection layer 236.

The first electrodes 220, in one embodiment, are separately formed for each of the R, G, and B sub-pixels. Although not illustrated in FIG. 2, a pixel-defining layer covering end and side portions of the first electrodes 220 may be formed on the first electrodes 220.

The hole injection layer 231 and the hole transport layer 233, in one embodiment, are sequentially stacked on the first electrodes 220 by using an open mask.

The auxiliary layer 232R is arranged between the hole injection layer 231 and the hole transport layer 233 in the R sub-pixel region so as to adjust a resonance period of red light. The auxiliary layer 232R is formed on the hole injection layer 231 by using an FMM.

Light emission layers 234R, 234G, and 234B are formed above the hole transport layer 233.

The red light-emission layer 234R is formed above the hole transport layer 233 by using the FMM in the R and B sub-pixel regions. That is, the red light-emission layer 234R is formed as a common layer in the R and B sub-pixel regions. Thus, a mask having a larger opening may be used so that, for example, it is advantageous for a manufacture of a large display panel, compared to a case in which a light emission layer is formed in each sub-pixel.

The green light-emission layer 234G is formed on the hole transport layer 233 by using the FMM in the G sub-pixel region.

The blue light-emission layer 234B is formed on the red light-emission layer 234R in the B sub-pixel region. The thickness of the blue light-emission layer 234B may be between about 100 Å to about 500 Å. The thickness of the red light-emission layer 234R may be between about 100 Å to about 500 Å.

As described above, since the blue light-emission layer 234B is formed on the red light-emission layer 234R that is commonly stacked in the red and blue sub-pixel regions, formation of dark spots may be prevented or reduced in a B sub-pixel. Generally, when a typical organic light emitting display apparatus is used for a long time, progressive dark spots may be formed in a blue sub-pixel. However, according to the present embodiment, as described above, since the blue light-emission layer 234B is formed on the red light-emission layer 234R, the thickness of an organic material in the B sub-pixel generating blue light is increased, thereby preventing or reducing dark spots from being formed in the B sub-pixel.

The electron transport layer 235 is formed on the light emission layers 234R, 234G, 234B above a front side of the substrate 200 by using an open mask.

The electron injection layer 236 is formed on the electron transport layer 235 above the front side of the substrate 200 by using the open mask.

Although not illustrated in FIG. 2, a hole blocking layer may be selectively formed between the light emission layers 234R, 234G, 234B and the electron transport layer 235 by using a hole blocking layer-forming material.

The second electrode 240 is formed on the electron injection layer 236, as a common electrode that extends over the R, G, and B sub-pixels and connects (e.g., electrically connects) the R, G, and B sub-pixels.

Figure 3:
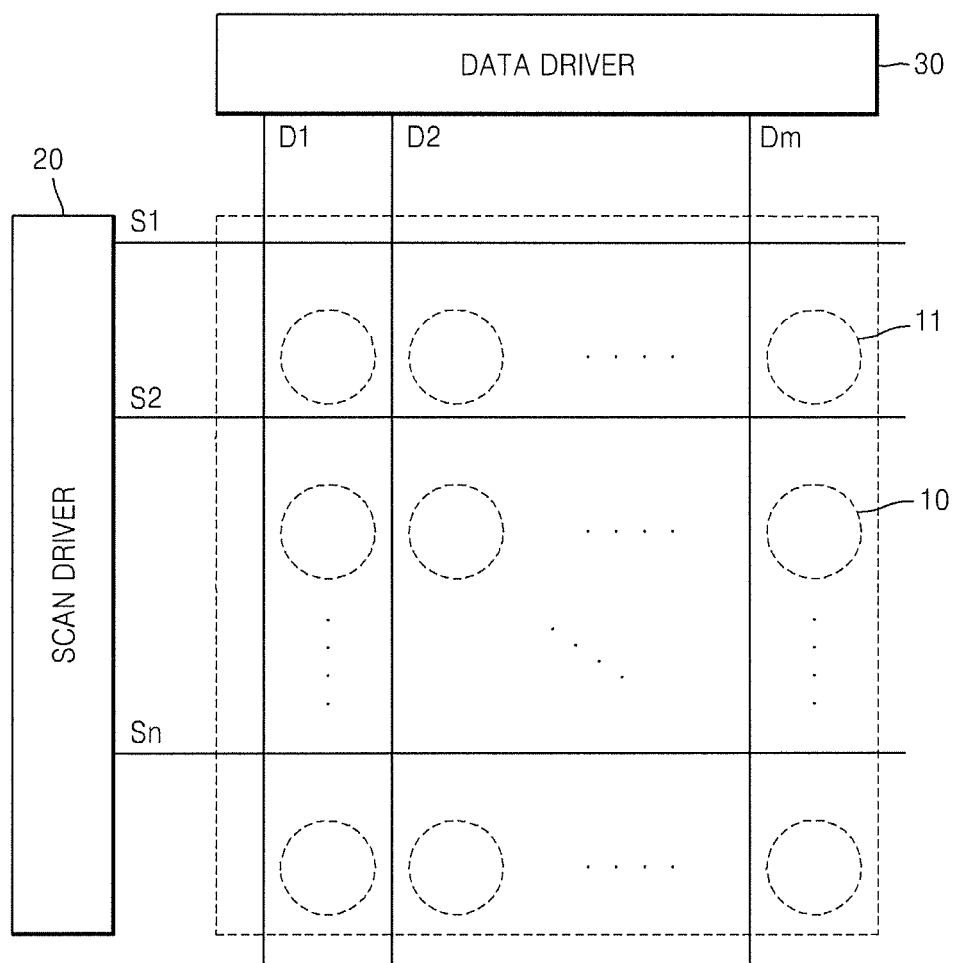
FIG. 3 is a block diagram of an organic light emitting display apparatus that incorporates the embodiment of FIG. 1 or FIG. 2.

FIG. 3 is a block diagram of an organic light emitting display apparatus that incorporates the embodiment of FIG. 1 or FIG. 2.

The organic light emitting display apparatus according to the described embodiment of the present invention includes, as shown in FIG. 3, an organic light emitting display panel 10, a scan driver 20, and a data driver 30.

The organic light emitting display panel 10 includes a plurality of data lines $D_1$ to $D_M$ arranged in columns, a plurality of scan lines $S_1$ to $S_N$ arranged in rows, and a plurality of pixel circuits 11. The data lines $D_1$ to $D_M$ transfer a data voltage representing an image signal to the pixel circuits 11. The scan lines $S_1$ to $S_N$ transfer a selection signal for selecting the pixel circuits 11. Each of the pixel circuits 11 is formed in a pixel area defined by two adjacent data lines and two adjacent scan lines.

The scan driver 20 sequentially applies the selection signal to the scan lines $S_1$ to $S_N$, and the data driver 30 applies the data voltage representing an image signal to the data lines $D_1$ to $D_M$.

As described above, according to one or more embodiments of the present invention, the method of manufacturing the organic light emitting display apparatus may prevent or reduce the formation of dark spots, and may reduce the number of times of using the FMM, thereby obtaining a simple process and decreasing manufacturing costs, compared to a conventional R, G, and B independent patterning method.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light emitting display apparatus comprising:
 a plurality of sub-pixel regions comprising: a red sub-pixel region; a green sub-pixel region; and a blue sub-pixel region, each of the sub-pixel regions comprising a first electrode on a substrate;
 a distributed Bragg reflector (DBR) layer between the substrate and the first electrode;
 a hole injection layer on the DBR layer and covering the first electrode;
 a hole transport layer on the hole injection layer;
 an auxiliary layer between the hole injection layer and the hole transport layer in the green sub-pixel region;
 a green light-emission layer on the hole transport layer in the blue sub-pixel region and the green sub-pixel region;
 a blue light-emission layer on the green light-emission layer in only the blue sub-pixel region; and
 a red light-emission layer on the hole transport layer in only the red sub-pixel region.

2. The organic light emitting display apparatus of claim 1, wherein the DBR layer is formed by alternately stacking a first layer and a second layer, wherein the first layer and the second layer have different refractive indexes.

3. The organic light emitting display apparatus of claim 2, wherein a refractive index of the first layer is less than a refractive index of the second layer.

4. The organic light emitting display apparatus of claim 2, wherein the first layer comprises silicon oxide (SiOx), and the second layer comprises silicon nitride (SiNx).

5. The organic light emitting display apparatus of claim 1, further comprising a passivation layer between the substrate and the DBR layer.

6. The organic light emitting display apparatus of claim 5, wherein the passivation layer has a thickness of about 3000 Å to about 6000 Å.

7. The organic light emitting display apparatus of claim 1, wherein the green light-emission layer has a hole transport ability.

8. The organic light emitting display apparatus of claim 1, wherein the auxiliary layer has a hole transport ability.

9. The organic light emitting display apparatus of claim 1, wherein the auxiliary layer comprises a same material as the hole transport layer.

10. An organic light emitting display apparatus comprising:
 a plurality of sub-pixel regions comprising: a red sub-pixel region; a green sub-pixel region; and a blue sub-pixel region, each of the sub-pixel regions comprising a first electrode on a substrate;
 a distributed Bragg reflector (DBR) layer between the substrate and the first electrode;
 a hole injection layer on the DBR layer and covering the first electrode;

a hole transport layer on the hole injection layer;

an auxiliary layer between the hole injection layer and the hole transport layer in the red sub-pixel region;

a red light-emission layer on the hole transport layer in the blue sub-pixel region and the red sub-pixel region;

a blue light-emission layer on the red light-emission layer in only the blue sub-pixel region; and a green light-emission layer on the hole transport layer in only the green sub-pixel region.

11. The organic light emitting display apparatus of claim 10, wherein the DBR layer is formed by alternately stacking a first layer and a second layer, wherein the first layer and the second layer have different refractive indexes.

12. The organic light emitting display apparatus of claim 11, wherein a refractive index of the first layer is less than a refractive index of the second layer.

13. The organic light emitting display apparatus of claim 11, wherein the first layer comprises silicon oxide (SiOx), and the second layer comprises silicon nitride (SiNx).

14. The organic light emitting display apparatus of claim 10, further comprising a passivation layer between the substrate and the DBR layer.

15. The organic light emitting display apparatus of claim 14, wherein the passivation layer has a thickness of about 3000 Å to about 6000 Å.

16. The organic light emitting display apparatus of claim 10, wherein the red light-emission layer has a hole transport ability.

17. The organic light emitting display apparatus of claim 10, wherein the auxiliary layer has a hole transport ability.

18. The organic light emitting display apparatus of claim 10, wherein the auxiliary layer comprises a same material as the hole transport layer.

19. A method of manufacturing an organic light emitting display apparatus, the method comprising:

forming a distributed Bragg reflector (DBR) layer on a substrate on which a red sub-pixel region, a green sub-pixel region, and a blue sub-pixel region are located;

forming a first electrode on the D13R layer and corresponding to the red, green, and blue sub-pixel regions;

forming a hole injection layer on the substrate and covering the first electrode;

forming an auxiliary layer on the hole injection layer in the green sub-pixel region;

forming a hole transport layer on the hole injection layer and covering the auxiliary layer;

forming a green light-emission layer on the hole transport layer in the blue sub-pixel region and the green sub-pixel region;

forming a blue light-emission layer on the green light-emission layer in only the blue sub-pixel region; and forming a red light-emission layer on the hole transport layer in only the red sub-pixel region.

20. The method of claim 19, wherein the DBR layer is formed by alternately stacking a first layer and a second layer, wherein the first layer and the second layer have different refractive indexes.

21. The method of claim 20, wherein a refractive index of the first layer is less than a refractive index of the second layer.

22. The method of claim 20, wherein the first layer comprises silicon oxide (SiOx), and the second layer comprises silicon nitride (SiNx).

23. The method of claim 19, further comprising forming a passivation layer on the substrate, prior to the forming of the IBR layer.

24. The method of claim 23, wherein the passivation layer has a thickness of about 3000 Å to about 6000 Å.

25. The method of claim 19, wherein the green light-emission layer has a hole transport ability.

26. The method of claim 19, wherein the auxiliary layer has a hole transport ability.

27. The method of claim 19, wherein the auxiliary layer comprises a same material as the hole transport layer.

28. A method of manufacturing an organic light emitting display apparatus, the method comprising:

forming a distributed Bragg reflector (DBR) layer on a substrate on which a red sub-pixel region, a green sub-pixel region, and a blue sub-pixel region are located;

forming a first electrode on the DBR layer and corresponding to the red, green, and blue sub-pixel regions;

forming a hole injection layer on the substrate and covering the first electrode;

forming an auxiliary layer on the hole injection layer in the red sub-pixel region;

forming a hole transport layer on the hole injection layer and covering the auxiliary layer;

forming a red light-emission layer on the hole transport layer in the blue sub-pixel region and the red sub-pixel region;

forming a blue light-emission layer on the red light-emission layer in only the blue sub-pixel region; and forming green light-emission layer on the hole transport layer in only the green sub-pixel region.

29. The method of claim 28, wherein the DBR layer is formed by alternately stacking a first layer and a second layer, wherein the first layer and the second layer have different refractive indexes.

30. The method of claim 29, wherein a refractive index of the first layer is less than a refractive index of the second layer.

31. The method of claim 29, wherein the first layer comprises silicon oxide (SiOx), and the second layer comprises silicon nitride (SiNx).

32. The method of claim 28, further comprising forming a passivation layer above the substrate, prior to the forming of the DBR layer.

33. The method of claim 32, wherein the passivation layer has a thickness of about 3000 Å to about 6000 Å.

34. The method of claim 28, wherein the red light-emission layer has a hole transport ability.

35. The method of claim 28, wherein the auxiliary layer has a hole transport ability.

36. The method of claim 28, wherein the auxiliary layer comprises a same material as the hole transport layer.

* * * * *